US012580161B2

(12) United States Patent
Flaske et al.

(10) Patent No.: US 12,580,161 B2
(45) Date of Patent: Mar. 17, 2026

(54) HOLLOW CATHODE SYSTEM FOR GENERATING A PLASMA AND METHOD FOR OPERATING SUCH A HOLLOW CATHODE SYSTEM

(71) Applicant: Fraunhofer-Gesellschaft zur Förderung der angewandten Forschung e.V., Munich (DE)

(72) Inventors: Henrik Flaske, Dresden (DE); Meyer Björn, Dresden (DE); Mattausch Gösta, Dresden (DE); Stefan Weiss, Dresden (DE); Volker Kirchhoff, Dresden (DE); Burkhard Zimmermann, Dresden (DE); Rainer Labitzke, Dresden (DE); Jörg Kubusch, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/496,106

(22) Filed: Oct. 27, 2023

(65) Prior Publication Data

US 2024/0062995 A1     Feb. 22, 2024

Related U.S. Application Data

(63) Continuation of application No. PCT/EP2022/057255, filed on Mar. 18, 2022.

(30) Foreign Application Priority Data

Apr. 29, 2021   (DE) .......................... 102021111097.1

(51) Int. Cl.
| *H01J 37/32* | (2006.01) |
| *C23C 14/34* | (2006.01) |
| *C23C 14/54* | (2006.01) |

(52) U.S. Cl.
CPC .... H01J 37/32596 (2013.01); C23C 14/3407 (2013.01); C23C 14/54 (2013.01);
(Continued)

(58) Field of Classification Search
CPC ........... H01J 37/32596; H01J 37/32055; H01J 37/3244; H01J 2237/332; C23C 14/3407; C23C 14/54; H05H 1/481
See application file for complete search history.

(56) References Cited

U.S. PATENT DOCUMENTS

| 6,528,947 B1* | 3/2003 | Chen ................. | H01J 37/32596 315/111.21 |
| 2011/0318498 A1* | 12/2011 | Wadley ................. | C23C 14/246 427/458 |
| 2018/0350564 A1* | 12/2018 | Vane ................. | H01J 37/32596 |

FOREIGN PATENT DOCUMENTS

| CN | 209237668 U | 8/2019 |
| DE | 199 02 146 A1 | 8/2000 |
(Continued)

OTHER PUBLICATIONS

DE-102013106315-A1 Translation (Year: 2014).*
(Continued)

*Primary Examiner* — James Lin
*Assistant Examiner* — Patrick S Ott
(74) *Attorney, Agent, or Firm* — Crowell & Moring LLP

(57) ABSTRACT

A hollow cathode system generates a plasma. The system includes an anode device, a power supply for applying an electric current between a cathode tube and the anode device, and at least one gas reservoir for supplying the gas flowing through the cathode tube are used, in which at least two cathode tubes are used that are electrically connected to one another, and in which each cathode tube has a separate
(Continued)

actuator with which the amount of gas flowing through the respective cathode tube is set.

7 Claims, 5 Drawing Sheets

(52) U.S. Cl.
CPC .... *H01J 37/32055* (2013.01); *H01J 37/3244* (2013.01); *H01J 2237/332* (2013.01)

(56) References Cited

FOREIGN PATENT DOCUMENTS

| | | | |
|---|---|---|---|
| DE | 199 58 016 A1 | 12/2000 | |
| DE | 10 2006 027 853 A1 | 12/2007 | |
| DE | 10 2010 011 592 A1 | 9/2011 | |
| DE | 10 2013 210 155 A1 | 12/2014 | |
| DE | 102013106315 A1 * | 12/2014 | ............... H05H 1/42 |
| DE | 10 2014 110 835 A1 | 2/2016 | |
| EP | 1 177 714 | 2/2002 | |
| EP | 3 520 131 | 8/2019 | |
| JP | 2003-317999 A | 11/2003 | |
| WO | WO 00/65887 | 11/2000 | |
| WO | WO-0065887 A1 * | 11/2000 | ............. B01D 53/32 |
| WO | WO-2009018838 A1 * | 2/2009 | ............... H05H 1/34 |
| WO | WO 2010/099218 A1 | 9/2010 | |
| WO | WO 2013/091927 A1 | 6/2013 | |
| WO | WO 2018/059609 A1 | 4/2018 | |

OTHER PUBLICATIONS

International Search Report and Written Opinion of the International Search Authority mailed Jun. 27, 2022 in International Application No. PCT/EP2022/057255 (English and German languages) (13 pp.).

Office Action dated Mar. 17, 2022 for German Patent Application No. 10 2021 111 097.1, note: pp. 1 and 2 are English language Explanations to Section C. Result of Determination Document (10 pp.).

Office Action dated Nov. 25, 2022 for German Patent Application No. 10 2021 111 097.1, note: pp. 1 and 2 are English language Explanations to Section C. Result of Determination Document (8 pp.).

First Office Action issued for Japanese Application No. 2023566738, sent Jun. 17, 2025 (with German translation) (9 pp.).

* cited by examiner

HOLLOW CATHODE SYSTEM FOR GENERATING A PLASMA AND METHOD FOR OPERATING SUCH A HOLLOW CATHODE SYSTEM

RELATED APPLICATIONS

This application is a Continuation of International Patent Application No. PCT/EP2022/057255, filed Mar. 18, 2022, published as WO 2022/228778 A1, which claims priority to German Patent Application 10 2021 111 097.1, filed Apr. 29, 2021. All applications listed in this paragraph are hereby incorporated by reference in their entireties.

FIELD OF INVENTION

The invention relates to a hollow cathode system for generating a plasma that is used when coating or processing substrate surfaces in a vacuum, and a method for operating such a hollow cathode system.

BACKGROUND

Hollow cathode plasma sources have numerous uses, e.g. plasma activation in PVD processes, excitation in PECVD processes, stripping, cleaning or physical/chemical modification of surfaces, arc vaporization, or as a heat source. Hollow cathode discharge is basically a particularly efficient means of exciting a plasma between two cathode surfaces, between which a process gas flows (DE 10 2010 011 592 A1). Ions in the plasma region strike the inner walls of the cathode, thus emitting electrons in secondary electron emissions (hollow cathode glow discharge) or thermionic electron emission (hollow cathode arc discharge) to obtain the discharge, which involves various abrasive mechanisms. Ion bombardment results in a continuous sputtering effect in both cases. With an arc discharge, in which the hollow cathodes are typically tube-shaped, there are also increased sputtering rates, vaporization, recrystallization and brittleness, as well as chemically assisted stripping in reactive processes, as a result of the high operating temperatures. The ignition phase is also particularly abrasive, because this often involves material spattering as a result of the cold arcs. Consequently, these plasma sources have life spans of only a few hours (depending on the operating characteristics and process conditions). This is much too short for continuous operation over the course of an entire week, or occasionally two weeks, as is typical in industrial applications. In general, the short life spans of the cathodes result in significant delays because replacing the worn parts requires interrupting the process and ventilating the process chamber (contaminating the process environment), such that reconditioning is then necessary. Storing numerous complete plasma sources and the decoupling thereof from processing chambers using slide valves under a vacuum is extremely complicated and expensive and is therefore not economically feasible.

In addition to the problems having to do with wear and the limited life span, increasing the performance of the plasma is also a problem. The discharge flow in a hollow cathode arc discharge is limited by the maximum possible emission flow density of the hollow cathode material prior to reaching the melting temperature as well as by the limited emission surface area; the discharge is concentrated in a so-called active zone, i.e. a specific axial region in the hollow cathode where the process gas pressure and the unobstructed pathways of the plasma electrons are well suited to one another. Consequently, higher demands on the hollow cathode source will not result in a significant increase in the discharge, and instead, this can only be achieved through the expensive implementation of numerous plasma sources operated simultaneously.

DE 10 2006 027 853 A1 discloses a hollow cathode system in which a cathode tube is encompassed by an annular anode device and an annular magnetic coil, at least at the end where the gas is discharged. This hollow cathode system allows for a higher plasma intensity to be obtained than that with conventional hollow cathode plasma sources. WO 2013/091927 A1 discloses plasma sources that have two hollow cathodes, the discharge orifices of which face toward one another. A power source is applied therebetween that supplies an alternating current, resulting in the two hollow cathodes alternating between functioning as a cathode and an anode in a hollow cathode arc discharge. This plasma source also allows for a more intensive plasma to be generated between the two hollow cathodes than with a plasma source that only has one hollow cathode. Nevertheless, the length of time in which these hollow cathode systems can be operated is also limited by the life span of a cathode tube.

A third problem with hollow cathode systems concerns material losses due to wear. The hollow cathodes have to be replaced frequently as a whole, even though the wear is substantially concentrated to just the active zone.

SUMMARY

The problem addressed by the invention is therefore to create a hollow cathode system for generating a plasma, and a method for operating this hollow cathode system, with which the disadvantages in the prior art can be resolved. In particular, the hollow cathode system and method according to the embodiments should allow for longer operation than with the prior art. It should also be possible to adjust the strength of a plasma generated with the hollow cathode system according to the embodiments with this method.

These problems are solved by the features specified in the claims and described in the embodiments. Further advantageous embodiments of the invention can be derived from the dependent claims.

A hollow cathode system for generating a plasma according to the embodiments belongs to those types of devices with which a voltage provided by a power supply is applied to a cathode tube and an anode device. When a process gas from a gas reservoir also flows through the cathode tube, an arc discharge can be obtained between the cathode tube and the anode device inside a vacuum chamber. What distinguishes the hollow cathode system according to the embodiments is that it has at least two cathode tubes that are electrically connected to one another. These cathode tubes preferably have a circular inner cross section. The inner cross sections of the cathode tubes in a hollow cathode system according to the embodiments can also have some other geometric shape. A conductive connection between the individual cathode tubes can be obtained with contact elements, or through direct contact between two abutting cathode tubes. All of the cathode tubes in a hollow cathode system according to the embodiments therefore always have the same electrical potential. Furthermore, each cathode tube in a hollow cathode system according to the embodiments has a separate actuator with which the amount of gas flowing through the cathode tube from a first gas reservoir can be adjusted and/or the type of gas can be determined.

Because each cathode tube has a separate actuator for adjusting the amount of gas flowing through it, a hollow cathode arc discharge to the anode device can also be ignited separately. There is one anode device with which a hollow cathode arc discharge is obtained for all of the cathode tubes in the hollow cathode system according to the embodiments. It has been demonstrated in the prior art that the form of a plasma can be shaped by placing numerous anodes inside the vacuum chamber. The anode device in a hollow cathode system according to the embodiments can therefore contain numerous anodes. In another embodiment, one of the anodes is annular and encompasses all of the cathode tubes, at least where the gas discharge orifice is located on the cathode tubes.

Auxiliary devices are normally used in the prior art to ignite a hollow cathode, e.g. a heating coil wound around a hollow cathode, which is connected to a power supply. These auxiliary devices can also comprise magnetic coils or magnets that generate a magnetic field in and around the hollow cathode, or a device for generating high voltage pulses between the hollow cathode and the anode device. Each cathode tube in the hollow cathode system according to the embodiments can also have such a device for igniting an arc discharge. Any of the devices used in the prior art for igniting a hollow cathode arc discharge can be used.

As explained above, a separate arc discharge can be ignited and maintained from each cathode tube in the hollow cathode system according to the embodiments, such that a plasma can be obtained with each cathode tube. Each of these individual plasmas should then occupy the same volume.

For this reason, in one embodiment, the tubular axes of the at least two cathode tubes are parallel to one another, or form an angle no greater than 5° to one another, and the gas from the reservoir flows through the at least two cathode tubes in the same direction.

Because the plasmas generated by the at least two cathode tubes basically occupy the same volume, it is also advantageous if adjacent cathode tubes are no more than 20 mm apart.

The method according to the embodiments for operating a hollow cathode system comprising an anode device, a power supply that provides a voltage between the cathode tube and the anode device, and at least one first gas reservoir that supplies the gas that flows through the cathode tubes, is distinguished by the use of at least two cathode tubes that are connected to one another in an electrically conductive manner, in which each cathode tube has a separate actuator with which the amount of gas flowing through it is set and/or the type of gas is determined.

This hollow cathode system can be operated in basically two modes. In one of the modes, an arc discharge from at least one first cathode tube is ignited and maintained until the end of its life span. The amount of gas flowing through this first cathode tube that is necessary for igniting and maintaining an arc discharge between the first cathode tube and the anode device is set by a first actuator. When the at least one first cathode tube is worn out, the arc discharge from the first cathode tube is extinguished, and an arc discharge from at least one second cathode tube is ignited. The operating time of a hollow cathode system according to the embodiments can therefore be extended in comparison with that of the prior art, in which the vacuum chamber must be opened in order to replace a cathode tube when it wears out. With the approach described above an arc discharge is ignited once in a cathode tube and maintained until the cathode tube is worn out. The cathode tubes can also be activated in alternating cycles, ensuring that all of the cathode tubes wear out at substantially the same time, which has a positive effect with regard to maintaining homogenous process conditions.

In the second operating mode of the hollow cathode system according to the embodiments, the goal is not to extend the operating time, but instead to alter the strength of the plasma generated with the hollow cathode system. As explained above, the plasmas from the individual cathode tubes in the hollow cathode system according to the embodiments basically occupy the same volume within the vacuum chamber. By activating a second cathode tube while at least one arc discharge from a first cathode tube is burning, or by deactivating a second cathode tube while an arc discharge from at least two cathode tubes is burning, the strength of the plasma in the chamber can be altered. In the second operating mode, an arc discharge to the anode device from at least two cathode tubes is maintained, at least intermittently, to obtain a stronger plasma than would be the case when an arc discharge from only one cathode tube were burning.

The invention shall be explained below in greater detail in reference to exemplary embodiments shown in the drawings. Therein:

DETAILED DESCRIPTION

Figure 1:
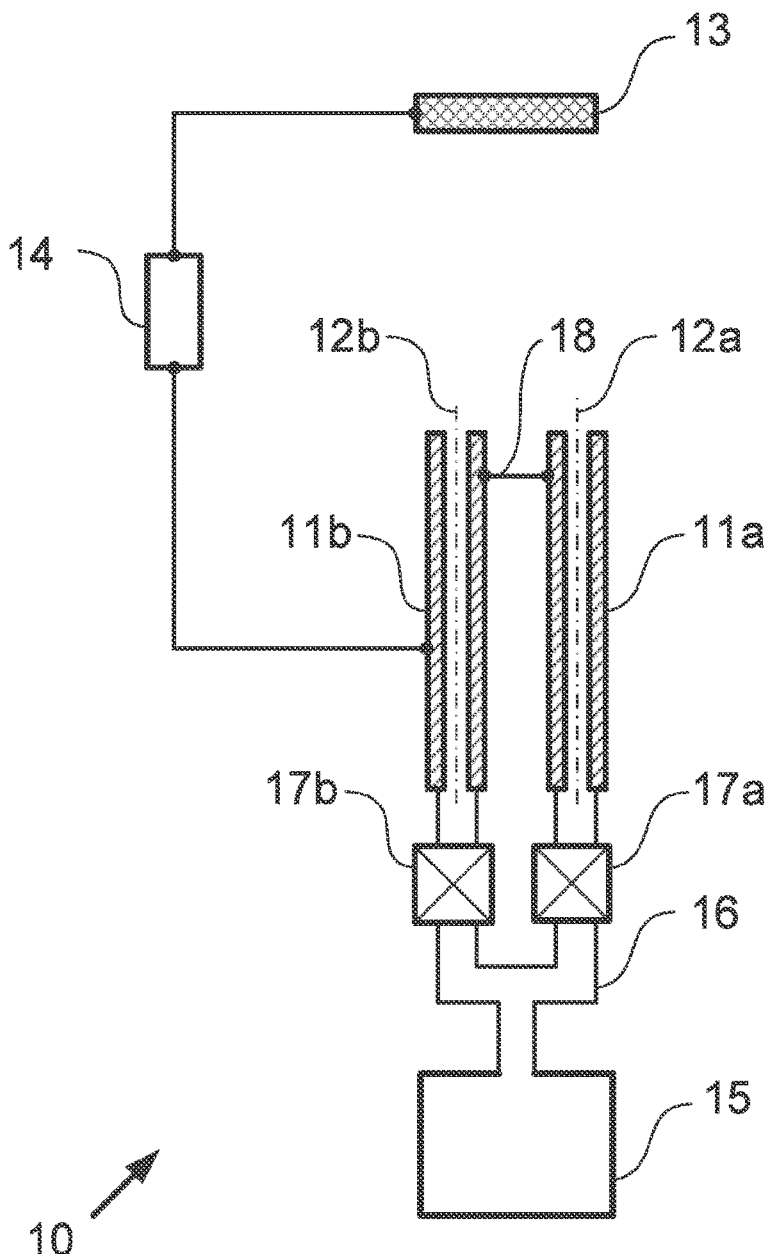
FIG. 1 shows a schematic illustration of a hollow cathode system according to an embodiment.

FIG. 1 shows a schematic illustration of a hollow cathode system 10 according to the embodiments. This hollow cathode system 10 comprises a first cathode tube 11a and second cathode tube 11b, which are no more than 20 mm from one another. The tubular axes 12a and 12b of the two cathode tubes 11a and 11b are parallel to one another. The hollow cathode system 10 also contains an anode device 13 and a power supply 14, which supplies a voltage necessary for obtaining an arc discharge between the first cathode tube 11a and/or second cathode tube 11b on one side and the anode device 13 on the other side. The two cathode tubes 11a and 11b, as well as the anode device 13, are inside a vacuum chamber, which is not shown in FIG. 1 for purposes of clarity.

While the hollow cathode system 10 is in operation, a process gas flows through the first cathode tube 11a and/or the second cathode tube 11b, which is supplied by a first gas reservoir 15 and conveyed through gas lines 16 to the cathode tubes 11a and 11b. The first cathode tube 11a has a first actuator 17a and the second cathode tube 11b has a second actuator 17b. The amount of gas flowing through each cathode tube can be set separately by the actuators 17a and 17b. The two cathode tubes 11a and 11b are connected to one another by an electrically conductive contact element 18 and therefore always have the same electrical potential. The contact element 18 can form a threaded socket made of an electrically conductive material, for example, into which the cathode tubes 11a and 11b can be screwed. There is no need for the contact element 18 if the two cathode tubes 11a and 11*b* are close enough together that they constantly abut one another. A separate arc discharge can therefore be obtained from each of the cathode tubes 11*a* and 11*b* to the anode device 13 in the hollow cathode system 10 by means of the two actuators 17*a* and 17*b*.

In a first variation of the method, the amount of gas flowing through the first cathode tube 11*a* with which it is possible to obtain an arc discharge between the first cathode tube 11*a* and the anode device 13 is first set with the first actuator 17*a*. An arc discharge between the first cathode tube 11*a* and the anode device 13 is therefore ignited and maintained. Any cathode tube participating in an arc discharge shall be referred to as an activated cathode tube below. If there is an arc discharge from the first cathode tube 11*a* to the anode device 13, then at this point, only the first cathode tube 11*a* is an activated cathode tube, while the second cathode tube 11*b* remains inactive. At this point, any substrates in the vacuum chamber can be processed with the plasma generated by the first cathode tube 11*a*. When the first cathode tube 11*a* wears out, the arc discharge between the first cathode tube 11*a* and the anode device 13 is extinguished. The amount of gas flowing through the second cathode tube 11*b* is then set by the second actuator 17*b* to obtain an arc discharge between the second cathode tube 11*b* and the anode device 13 that is ignited and maintained such that the processing of one or more substrates inside the vacuum chamber can continue with the plasma generated by the second cathode tube 11*b*. By this means, the operating time of the hollow cathode system can be extended in comparison with that of the prior art without having to open the vacuum chamber. Alternatively, the two cathode tubes 11*a* and 11*b* can be activated in alternating cycles, so that the cathode tubes 11*a* and 11*b* wear out at more or less the same times. The second cathode tube is preferably activated only when the first cathode tube has been deactivated. It is also possible to active the second cathode tube just before or at the same time the first cathode tube is deactivated.

In a second variation of the method, as with the first variation, the amount of gas flowing through the first cathode tube 11*a* with which it is possible to obtain an arc discharge between the first cathode tube 11*a* and the anode device 13 is set by the first actuator 17*a*. Therefore, only the first cathode tube 11*a* is activated initially to generate a plasma with which one or more substrates inside the vacuum chamber can be processed. When a stronger plasma is later needed for processing substrates inside the vacuum chamber, the amount of gas flowing through the second cathode tube 11*b* with which it is possible to obtain an arc discharge between the second cathode tube 11*b* and the anode device 13 is then set by the second actuator 17*b*, by means of which a supplementary plasma cloud is generated. The amperages necessary for maintaining the respective arc discharges from each cathode tube can be set individually. Because the two cathode tubes 11*a* and 11*b* are right next to one another, their plasma clouds merge, at least in part, such that a more powerful overall plasma can be generated. If a less powerful plasma is needed later, the arc discharge from one of the activated cathode tubes 11*a* and 11*b* can then be extinguished.

In the exemplary embodiment of a hollow cathode system according to the embodiments shown in FIG. 1, the cathode tube configuration comprises a total of two cathode tubes. The hollow cathode system according to the embodiments can also have a cathode tube configuration comprising more than just two cathode tubes. There is no upper limit to the number of possible cathode tubes. It is only necessary for the cathode tubes to be electrically connected to one another, and that the adjacent cathode tubes be no more than 20 mm from one another.

Figure 2A:
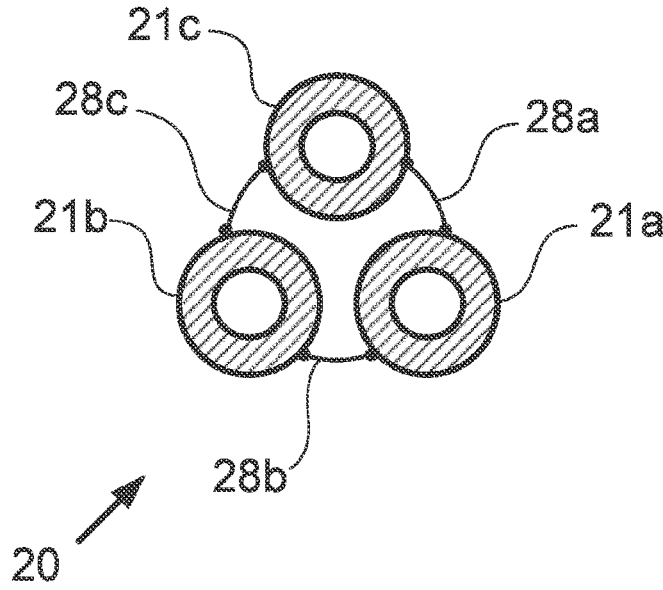
FIGS. 2a, 2b show a schematic sectional view of a first alternative cathode tube configuration.
Figure 2B:
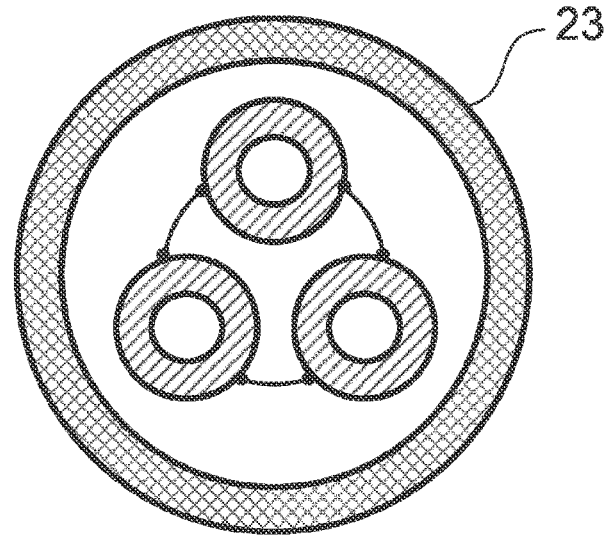

A cross section of an exemplary cathode tube configuration 20 according to the embodiments is schematically illustrated in FIG. 2*a*, which comprises three cathode tubes 21*a*-21*c*. The cathode tubes 21*a*-21*c* are electrically connected to one another by contact elements 28*a*-28*c*. As explained above in reference to the device 10 in FIG. 1, each of the cathode tubes 21*a*-21*c* has a separate actuator with which the amount of gas flowing through each cathode tube can be set separately. Consequently, a separate arc discharge to the anode device can also be obtained from each cathode tube 21*a*-21*c*, such that a hollow cathode system according to the embodiments that has this cathode tube configuration 20 can also be operated with both variations of the method described above in reference to FIG. 1. The same also applies to hollow cathode systems according to the embodiments that have the cathode tube configurations 20 described below. FIG. 2*b* also shows a cross section of the cathode tube configuration shown in FIG. 2*a* in a schematic illustration. In the embodiment shown in FIG. 2*b*, the cathode tube configuration 20 is encompassed by an annular element 23 of the anode device for the cathode tubes, at least at the end of the cathode tubes where the discharge orifice is located. Cathode tubes in a hollow cathode system according to the embodiments can also be operated with an annular anode of this type using the method described in DE 10 2006 027 853 A1, for example. An annular element 23 in an anode device can also be used with all of the cathode tube configurations according to the embodiments describe herein, in which the annular element encompasses all of the cathode tubes in a cathode tube configuration, at least at the ends where the gas discharge orifices are located.

Figure 3:
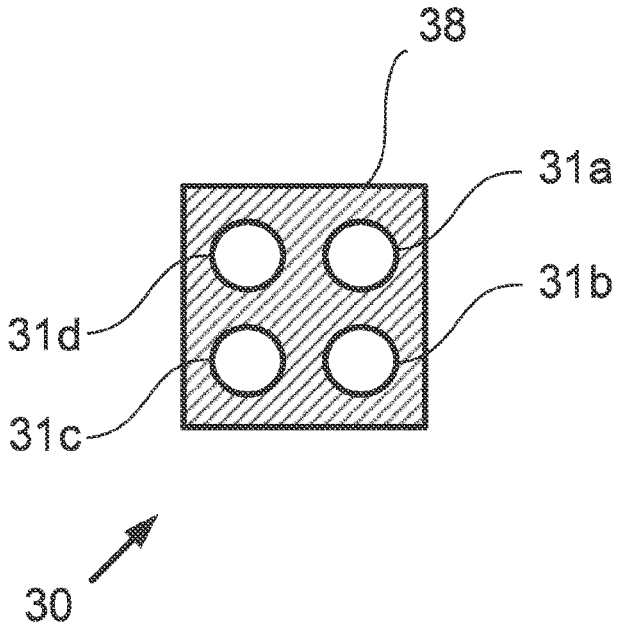
FIG. 3 shows a schematic sectional view of a second alternative cathode tube configuration.

The cathode tubes in the hollow cathode system according to the embodiments in all of the exemplary embodiments described above are formed by separate tubes connected to one another by electrically conductive contact elements. FIG. 3 shows a cross section of a schematic illustration of a cathode tube configuration 30 in which a total of four cylindrical holes 31*a*-31*d* pass through a block 38 made of an electrically conductive material. The outer cylindrical surfaces of the four holes 31*a*-31*d* in the block 38 function as the cathode tubes in this case, through which a process gas for obtaining an arc discharge flows. Each hole 31*a*-31*d* has a separate actuator with which the gas flowing through it can be controlled separately.

As explained above, hollow cathode systems normally have auxiliary devices such as a heating coil with a power supply with which an arc discharge in a cathode tube can be ignited. The cathode tubes in all of the exemplary embodiments described above can also have such an auxiliary device for igniting an arc discharge. In this manner, with exemplary embodiments in which the cathode tubes are formed by separate tubes, as is the case in the exemplary embodiments shown in FIGS. 1 through 2*b*, each cathode tube can have a separate heating coil wound around it, or each cathode tube can have a separate heating element. In the exemplary embodiment shown in FIG. 3, a heating coil can be wound around the entire block 38.

Figure 4:
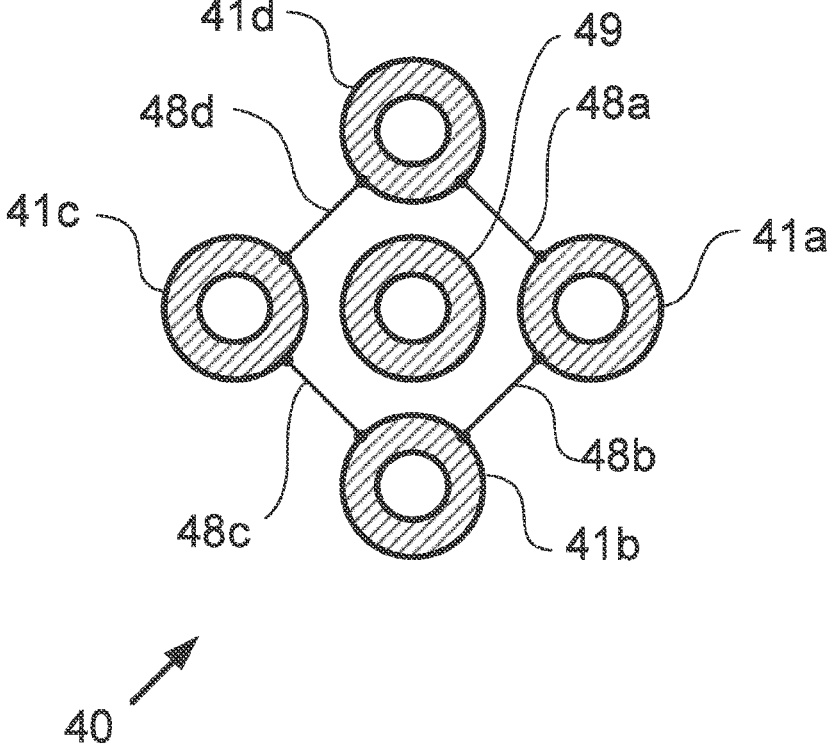
FIG. 4 shows a schematic sectional view of a third alternative cathode tube configuration.

FIG. 4 shows a cross section of a schematic illustration of a cathode tube configuration 40 comprising four cathode tubes 41*a*-41*d*, which are electrically connected to one another by contact elements 48*a*-48*d*. A plasma can be generated inside a vacuum chamber with the cathode tubes 41*a*-41*d* using the approach described above, by means of which at least one substrate can be processed inside the vacuum chamber. There is a fifth cathode tube 49 in the middle of the four cathode tubes 41a-41d, which is electrically insulated from the four cathode tubes 41a-41d, and has a separate power supply for obtaining an arc discharge. When the hollow cathode system according to the embodiments, which comprises the cathode tube configuration 40, is in operation, an arc discharge from the fifth cathode tube 49 is ignited to generate a plasma. This plasma, generated by the fifth cathode tube 49, has a lower intensity than the plasma obtained with the first four cathode tubes 41a-41d. The plasma generated with the fifth cathode tube 49 is also not primarily involved in the processing of a substrate, but instead is mainly used as a charge carrier in the space between the cathode tubes and the anode device, which facilitates ignition of at least one the cathode tubes 41a-41d.

Because the plasma generated by the fifth cathode tube 49 has a low intensity, this cathode tube 49 is subjected to less wear than the other cathode tubes 41a-41d. Consequently, an arc discharge can be maintained with the fifth cathode tube 49 during the entire operating time of the hollow cathode system according to the embodiments that has this cathode tube configuration 40, while the cathode tubes 41a-41d are activated successively or in alternating cycles.

It has already been explained that with the hollow cathode system according to the embodiments, at least two cathode tubes take part, wherein at least one first cathode tube can be activated while at least one second cathode tube is inactive during the operation of the hollow cathode system according to the embodiments. When the second cathode tube is inactive, either no gas flows through the cathode tube, or only a small amount of gas flows through the second cathode tube, which is not enough to obtain an arc discharge between the second cathode tube and the anode device. When a smaller amount of gas flows through the second cathode tube than that necessary for obtaining an arc discharge, it can be used to clean the second cathode tube to prevent an accumulation of particles therein from the activated first cathode tube or the material coating a substrate inside the vacuum chamber. The process gas in the first gas reservoir, which is the same gas that is used to obtain an arc discharge in an activated cathode tube, can also be used for the cleansing gas in an inactive cathode tube, for example. It is also possible to use another gas, preferably an inert gas, to clean the cathode tube, which can be contained in a second gas reservoir.

When a different gas is used to clean a cathode tube than that used for igniting and maintaining an arc discharge, the type of gas that flows through the respective cathode tubes can be determined by the actuator that also sets the amount of gas flowing through the cathode tube. The type of gas flowing through a respective cathode tube can also be determined by a separate actuator.

Figure 5:
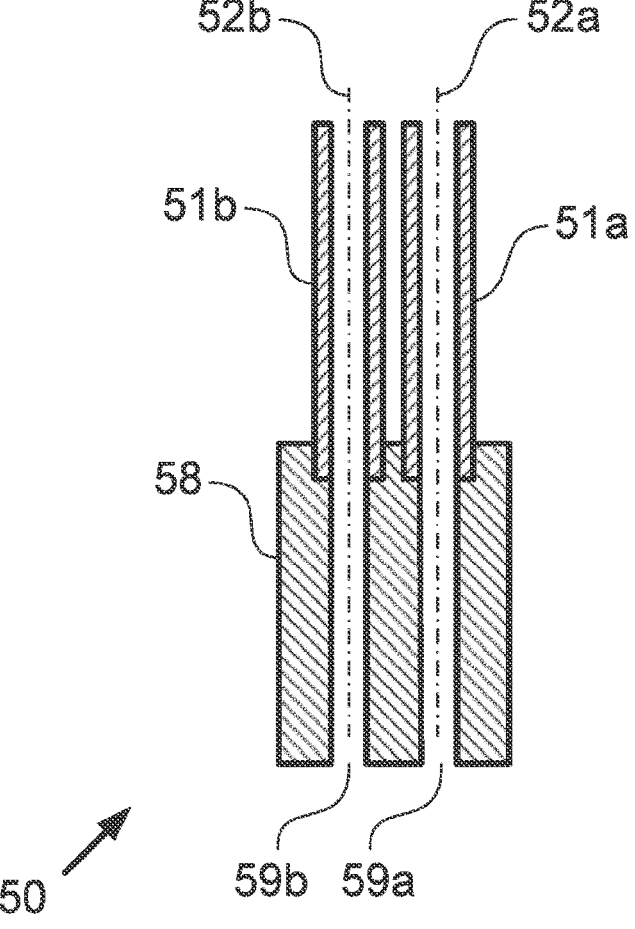
FIG. 5 shows a schematic sectional view of a fourth alternative cathode tube configuration.

While the cathode tubes in the exemplary embodiments shown in FIGS. 1, 2a, 2b, and 4 are formed by separate tubes, and by holes in a block of material in the exemplary embodiment shown in FIG. 3, FIG. 5 shows a cathode tube configuration 50 cut longitudinally in a schematic illustration, which is composed of a combination of separate cathode tubes and holes in a block of material. The cathode tube configuration 50 comprises a base element 58 made of an electrically conductive material, which contains two cylindrical holes 59a and 59b that extend through the entire length of the base element 58. These holes 59a and 59b are not as long, however, as a cathode tube. For this reason, cathode tube subsections 51a and 51b are also attached to the base element 58, preferably releasably, such that the tubular axis 52a of the cathode tube subsection 51a and the cylinder axis of the cylindrical hole 59a are identical, and the tubular axis 52b of the cathode tube subsection 51b and the cylinder axis of the cylindrical hole 59b are also identical. The cylinder axis of a hole and the tubular axis of the associated cathode tube subsection can also be offset, in order to break any beam coming from the interior of the vacuum chamber. To form the releasable connection, the cathode tube subsections 51a and 51b can have external threads that are then screwed into the base element 58. This results in a first cathode tube formed by the hole 59a and the associated cathode tube subsection 51a, while the hole 59b forms a second cathode tube with the associated cathode tube subsection 51b. The cathode tube configuration 50 comprises only two cathode tubes in this example, but can also comprise more than two cathode tubes in other embodiments.

As explained above, a hollow cathode normally wears out only in the active zone, which is located in the cathode tube subsections 51a and 51b in a hollow cathode system that has the cathode tube configuration 50. This means that it is only necessary to replace the worn out cathode tube subsections in the cathode tube configuration 50, without having to replace the entire cathode tubes, thus reducing material waste. This saves a significant amount of material if the length of the holes 59a and 59b is at least 30% of the overall length of the cathode tube, comprising the length of the hole combined with that of the associated cathode tube subsection.

The invention claimed is:

1. A hollow cathode system for generating a plasma, the system comprising:
   at least two cathode tubes;
   an anode device;
   a power supply for supplying a voltage between at least one of the cathode tubes and the anode device; and
   at least one gas reservoir for supplying a gas that flows through at least one of the cathode tubes, wherein at least two of the cathode tubes are physically and electrically connected to one another via a connection, and each have a separate actuator with which an amount of gas flowing through can be set.

2. The hollow cathode system according to claim 1, wherein tubular axes of the at least two cathode tubes are parallel to one another, or form an angle no greater than 5°.

3. The hollow cathode system according to claim 2, wherein the gas flows through the at least two cathode tubes in a same direction.

4. The hollow cathode system according to claim 1, wherein adjacent cathode tubes are no more than 20 mm apart from one another.

5. The hollow cathode system according to claim 1, wherein at least one element in the anode device is annular, wherein this at least one element in the anode device encompasses the at least two cathode tubes.

6. The hollow cathode system according to claim 1, wherein the cathode tubes are electrically connected to one another via a contact element.

7. The hollow cathode system according to claim 1, wherein the cathode tubes are electrically connected to one another via direct contact between one another.

* * * * *